United States Patent
Divakaruni et al.

(10) Patent No.: US 6,404,000 B1
(45) Date of Patent: Jun. 11, 2002

(54) PEDESTAL COLLAR STRUCTURE FOR HIGHER CHARGE RETENTION TIME IN TRENCH-TYPE DRAM CELLS

(75) Inventors: Rama Divakaruni, Somers; Rajarao Jammy, Wappingers Falls; Byeong Y. Kim, Lagrangeville; Jack A. Mandelman, Stormville; Akira Sudo, Poughkeepsie, all of NY (US); Dirk Tobben, Dresden (DE)

(73) Assignees: International Business Machines Corporation, Armonk, NY (US); Infineon Technologies North America Corp., San Jose, CA (US); Kabushiki Kaisha Toshiba, Kawasaki (JP)

( * ) Notice: Subject to any disclaimer, the term of this patent is extended or adjusted under 35 U.S.C. 154(b) by 17 days.

(21) Appl. No.: 09/599,261

(22) Filed: Jun. 22, 2000

(51) Int. Cl.$^7$ ............................................. H01L 29/72
(52) U.S. Cl. ................. 257/296; 257/301; 257/302; 257/304; 257/305
(58) Field of Search ................. 257/296, 301, 257/302, 304, 305

(56) References Cited

U.S. PATENT DOCUMENTS

| | | | |
|---|---|---|---|
| 4,651,406 A | * | 3/1987 | Shimizu et al. ............. 257/396 |
| 5,432,365 A | | 7/1995 | Chin et al. |
| 5,482,883 A | | 1/1996 | Rajeevakumar |
| 5,618,751 A | | 4/1997 | Golden et al. |
| 5,723,355 A | * | 3/1998 | Chang et al. ................ 257/369 |
| 5,847,432 A | * | 12/1998 | Nozaki ........................ 257/369 |
| 5,945,704 A | | 8/1999 | Schrems et al. |
| 6,184,549 B1 | * | 2/2001 | Furukawa et al. .......... 257/296 |

FOREIGN PATENT DOCUMENTS

JP  04304654 A  10/1992

OTHER PUBLICATIONS

D. M. Kennedy, "Post Diffusion Insulation", IBM Technical Disclosure Bulletin, vol. 32, No. 5B, Oct. 1989, pp. 384–385.

* cited by examiner

Primary Examiner—Edward Wojciechowicz
(74) Attorney, Agent, or Firm—McGinn & Gibb, PLLC; Ira D. Blecker, Esq.

(57) ABSTRACT

A memory structure having a trenched formed in a substrate. A collar oxide is located in an upper portion of the trench and includes a pedestal portion. A method of forming a memory device having a collar oxide with pedestal collar is also disclosed.

19 Claims, 11 Drawing Sheets

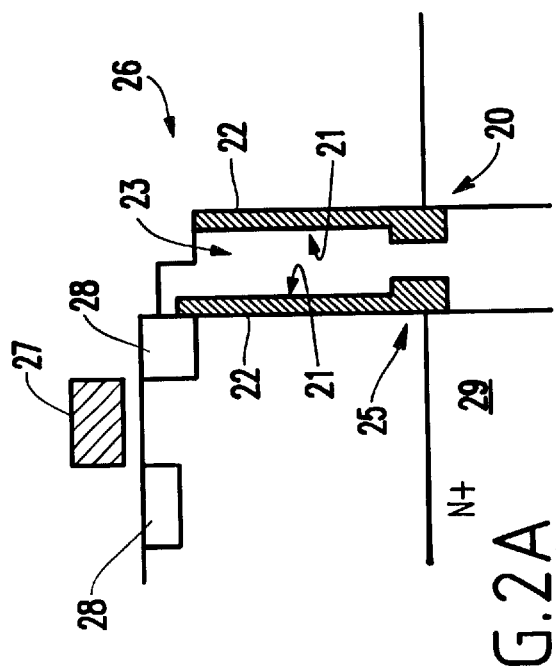
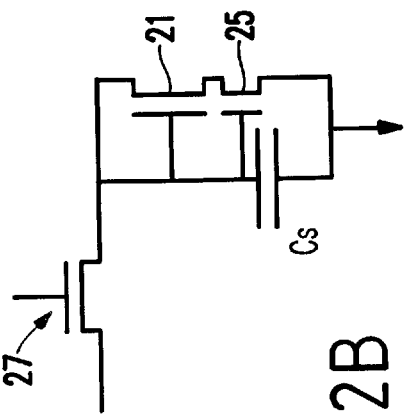
FIG.1A
FIG.1B
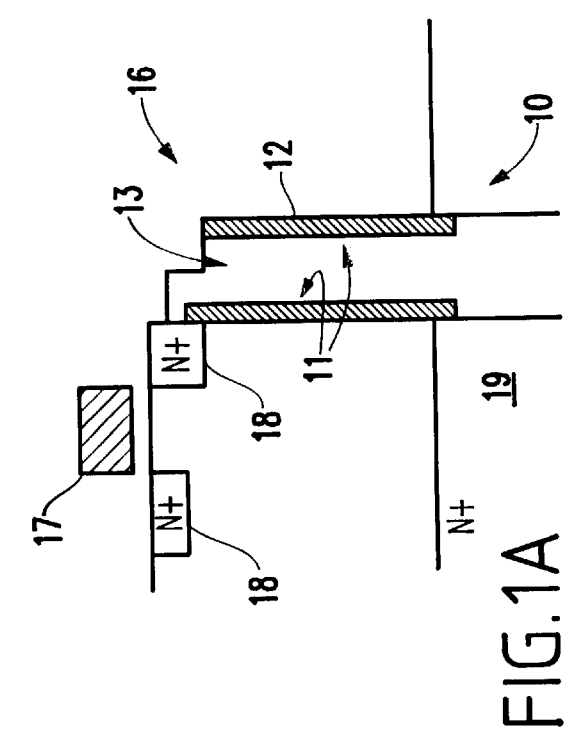
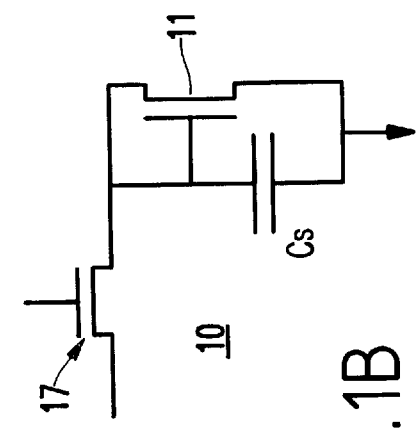
FIG.2A
FIG.2B

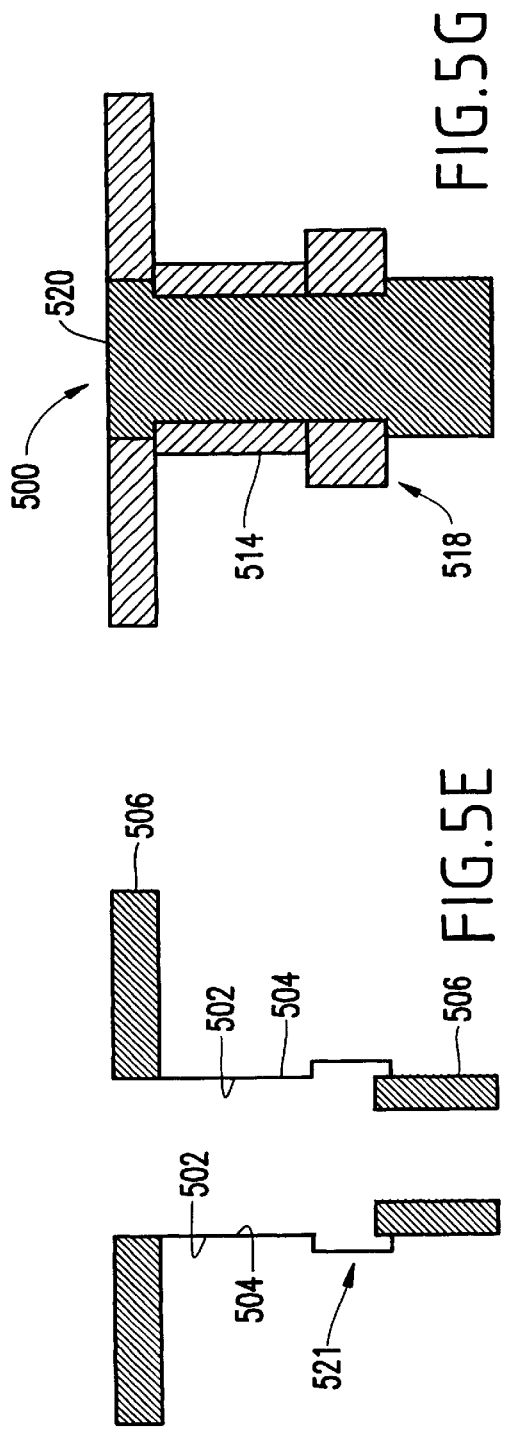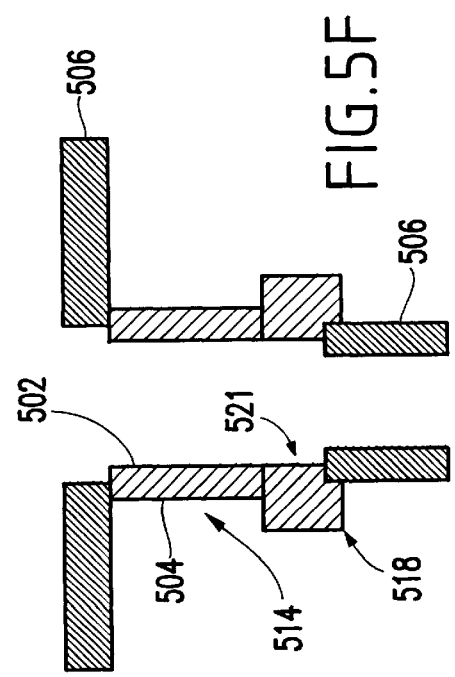

PEDESTAL COLLAR STRUCTURE FOR HIGHER CHARGE RETENTION TIME IN TRENCH-TYPE DRAM CELLS

BACKGROUND OF THE INVENTION

1. Field of the Invention

The present invention relates to DRAM memory cell structures, and in particular, a trench-type capacitor with enhanced charge retention.

2. Description of the Related Art

Traditional trench capacitors naturally discharge over time. One cause of such discharge is the leakage current between the storage node and the buried plate (i.e., surface node diffusion). One way to increase charge retention time is by reducing leakage current between the storage node diffusion and the buried plate.

Referring to FIG. 1(a), an example of one major leakage pathway in a conventional trench-type memory cell is depicted using a parasitic vertical transistor 10. The transistor 10 includes collar oxide 11 formed on the interior surface 12 of trench 13. Transistor 10 is incorporated into DRAM memory cell 16 which further includes a gate 17, storage nodes 13,18 and a buried plate 19.

FIG. 1(b) depicts an electrical circuit diagram corresponding to the transistor 10.

Several conventional methods have been proposed or implemented to address current leakage. Increasing the threshold voltage of parasitic transistor 10 can reduce the leakage current. The threshold voltage can be increased by ion (p-type in case of p-type well) implantation into the well at a depth within the parasitic channel. Threshold voltage can also be increased by increasing the collar oxide 11 thickness.

However, both of the methods have problems when incorporated into a high density DRAM process. For example, ion implantation can induce undesirable impurities into other areas. Since the aspect ratio (collar depth/trench opening) is very high (e.g. 1 $\mu$m /0.15 $\mu$m=6.7), the implantation angle needs to be almost parallel to collar oxide or vertical to wafer surface. As a result of the implantation angle, relatively high energy ion implantation is necessary and may result in undesirable implantation into the active channel region.

A disadvantage of a thicker collar oxide is a reduction in the trench opening. Reducing the trench opening leads to an increase in storage electrode resistance. An additional disadvantage of reducing the trench opening is the possible increase in complexity required to fill a trench with a narrow opening.

SUMMARY OF THE INVENTION

It is, therefore, an object of the present invention to provide a structure and method for a trench-type capacitor with enhanced charge retention.

According to one aspect of the present invention, a memory structure has a trenched formed in a substrate. A collar oxide is located in an upper portion of the trench and includes a pedestal portion.

According to another aspect of the present invention, a dynamic random access memory device includes a trench formed in a substrate having an upper portion. A collar oxide is located in the upper portion of the trench. The collar oxide includes a pedestal. A conductor fills the trench. The pedestal reduces a leakage of a charge on the conductor.

According to yet another aspect, the present invention comprises a method of forming a memory device. The method includes forming a trench in a substrate. A non-conformal oxide is deposited in an upper portion of the trench, wherein the non-conformal oxide is thicker along horizontal surfaces than vertical surfaces. Pedestals are formed on a lower portion of the non-conformal oxide.

BRIEF DESCRIPTION OF THE DRAWINGS

The foregoing and other objects, aspects and advantages will be better understood from the following detailed description of a preferred embodiment of the invention with reference to the drawings, in which:

FIG. 1(a) is a schematic diagram of conventional trench-type capacitor;

FIG. 1(b) is an electrical circuit diagram corresponding to the trench-type capacitor of FIG. 1(a);

FIG. 2(a) is a schematic diagram of trench capacitor according to one aspect of the present invention;

FIG. 2(b) is an electrical schematic diagram corresponding to the trench capacitor of FIG. 2(a);

FIGS. 5(a)–5(h) depict a method for forming a trench capacitor with a collar oxide having a thickened oxide portion formed thereon according to yet another aspect of the present invention;

DETAILED DESCRIPTION OF PREFERRED EMBODIMENTS OF THE INVENTION

Figure 3C:
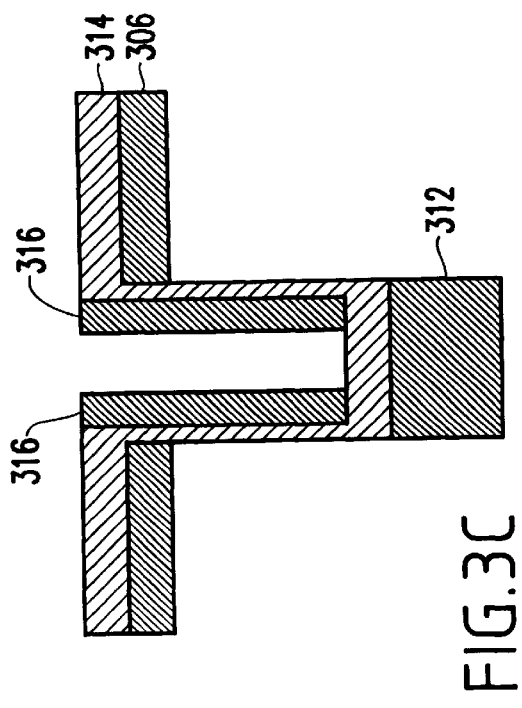
FIGS. 3(a)–3(f) depict a method for forming a trench capacitor with a collar oxide having a locally thickened oxide portion formed thereon according to one aspect of the present invention.

Referring now to FIG. 2(a), trench capacitor 20 has a collar oxide 21 formed along the interior sidewall surfaces 22 of trench 23. Collar oxide 21 has a locally thick oxide portion, forming a pedestal collar 25. In a preferred embodiment, collar oxide 21 comprises a non-conformal oxide formed by chemical vapor deposition (CVD). Trench capacitor 20 is incorporated into a DRAM memory cell 26 which includes a gate 27, storage nodes 28 and a buried plate 29.

Using trench capacitor 20, it is possible to reduce leakage current between storage nodes 23 and the buried plate 29. The leakage current (or sub-threshold current of MOS transistor) is an exponential function of threshold voltage and is an inversely proportional function of channel length. Therefore, leakage current can be reduced significantly by increasing collar oxide thickness over a portion of the collar length (threshold voltage control is more effective than channel length control).

For example, FIG. 2(a) depicts 10% of collar oxide 21 (length wise) (i.e. pedestal collar 25) being thicker than the rest of collar oxide 21. This does not present a significant increase in storage polysilicon resistance due to a narrowing of the channel width by pedestal collar 25, as most of the storage polysilicon thickness (90% length-wise) will be the same as in a conventional transistor. However, the increase in oxide thickness is sufficient to increase the threshold voltage and reduce leakage current.

FIG. 2(b) depicts a circuit corresponding to trench 20 (FIG. 2(a)). The electrical circuit can be expressed in terms of a serial connection of two transistors, (e.g. defined by collar oxide 21 and pedestal collar 25) with different threshold voltages and channel lengths. The sum of the two channel lengths of transistor 20 (FIG. 2(a)) is the same as the channel length of trench-type transistor 10 (FIG. 1(a).

Figure 3D:
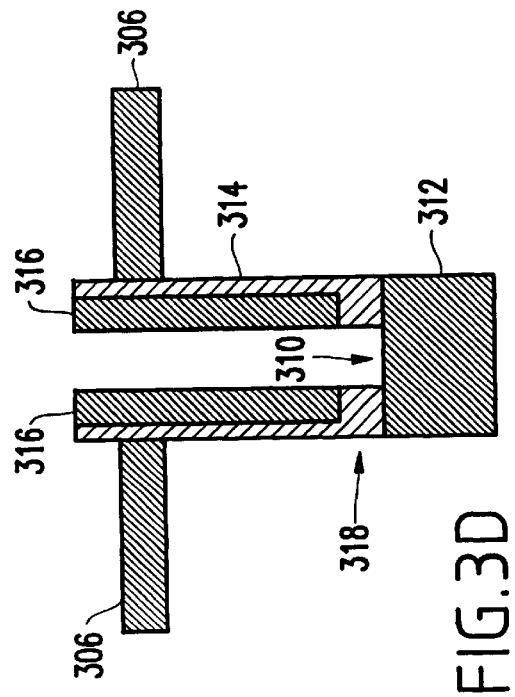
Figure 3A:
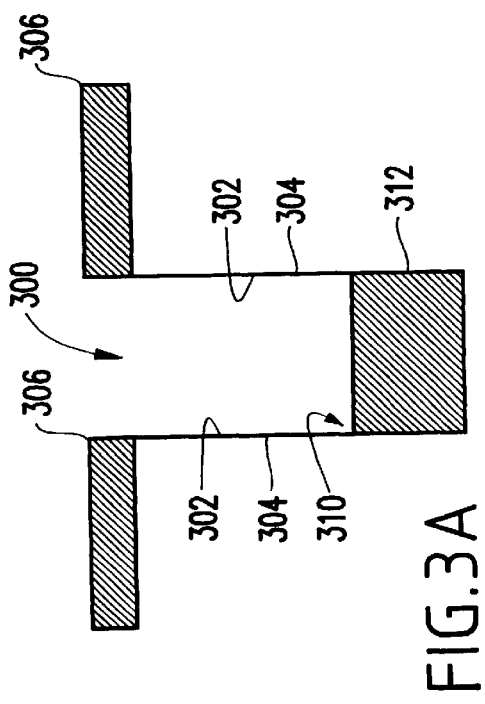

FIGS. 3(a)–3(f) depict one method for forming a trench capacitor with a collar oxide having a locally thick oxide portion (e.g., pedestal collar). Referring specifically to FIG. 3(a), a trench 300 is formed in a substrate. Trench 300 has interior sidewall surfaces 302 and exterior sidewall surfaces 304. A pad nitride layer 306 is formed on the wafer substrate. Polysilicon 310 fills the base 312 of trench 300.

Figure 3B:
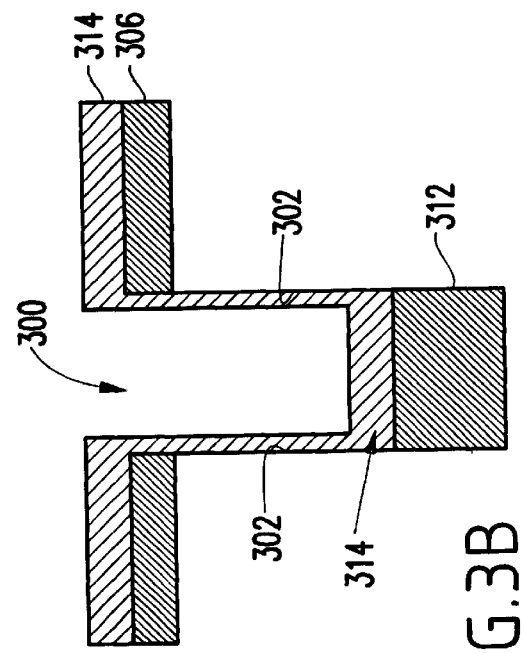

A non-conformal collar oxide 314 is deposited on interior sidewall surfaces 302 and along pad nitride 306 (FIG. 3(b)) Preferably, collar oxide 314 is deposited by a high density plasma (HDP) process. The oxide thickness on pad nitride 306 and polysilicon 312 is thicker than on the interior sidewall surfaces 302 of trench 300.

One advantage of the present embodiment is that the non-conformal collar oxide 314 allows selective ion implantation on trench surface 302. More specifically, the collar oxide 314 permits ion implantation into the trench wall (i.e. interior sidewall surface 302) through the relatively thin collar oxide 314. Meanwhile, the thicker portion of non-conformal oxide 314 with pad nitride 306 blocks ion implantation into the Si surface.

For example, if the deposited oxide 314 has a 5:1 thickness ratio between a horizontal (i.e. formed on pad nitride layer 306) and vertical direction (i.e. formed on interior sidewall surfaces 302), and if the implanted area depth is 1.0 $\mu$m, a trench width is 0.15 $\mu$m, then the required conventional implantation angle is less than 8.5 degrees (ATN(0.15/1)=8.53).

For effective blocking of implantation into silicon surface, the effective oxide thickness (i.e. height above the silicon wafer surface) should be at least 2000Å (300/sin(8.53)= 2022A). Therefore, 2000 Å of material must be deposited or formed on the silicon wafer including pad nitride 306. For an example with pad nitride 306 of 1500A only (conventional case), ion implantation into the silicon surface is inevitable. However, total thickness of pad nitride 306 (1500A) and the collar oxide thickness 314 (1500A) in this invention is much thicker than 2000A. Consequently, undesirable ion implantation into the wafer surface can be prevented during trench wall 302 implantation with the inventive collar oxide 314.

Polysilicon spacers 316 are then formed inside of trench 300 adjacent collar oxide 314 as shown in FIG. 3(c), using standard processing techniques such as polysilicon deposition and reactive ion etching (RIE) dry etching.

At this point, the doping level in the polysilicon spacer can be adjusted using conventional methods to control buried strap out diffusion (i.e. a low doped concentration for the spacer polysilicon and high doped concentration for the polysilicon fill (formed later)). A low doped concentration polysilicon will reduce arsenic out diffusion during subsequent thermal processing.

Collar oxide pedestal 318 is formed as a locally thick oxide region of collar oxide 314 by oxide RIE of the exposed oxide in the middle of the trench 300, as shown in FIG. 3(d) by removing a portion of the oxide layer 314 located at the base 310 of trench 300. The RIE process also removes the deposited oxide 314 from the surface of pad nitride 306. Alternatively, an oxide wet etch (not shown) can be substituted for the RIE process depicted in FIG. 3(d) to form collar oxide pedestal 318.

Figure 3E:
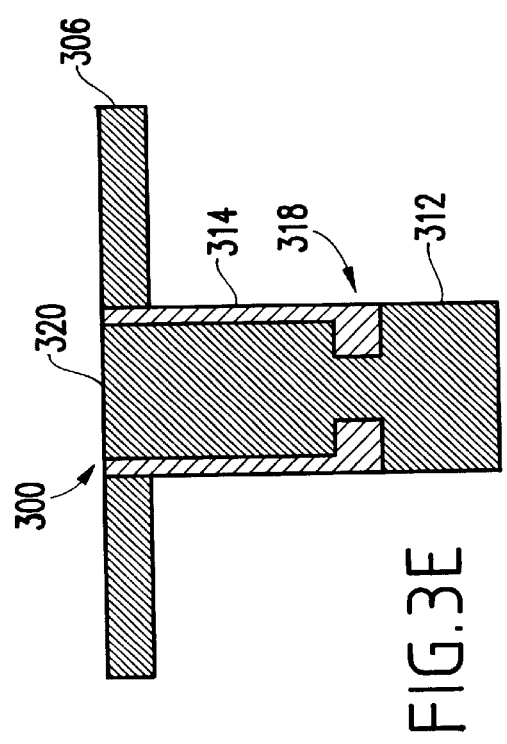

Polysilicon 320 is filled in trench 300 and planarized using chemical mechanical polishing (CMP) (FIG. 3(e)). As mentioned above, the invention allows the polysilicon spacers 316 to have a different doping concentration than the polysilicon fill 320, which reduces dopant (e.g., arsenic) outdiffusion during subsequent thermal cycles.

Figure 3F:
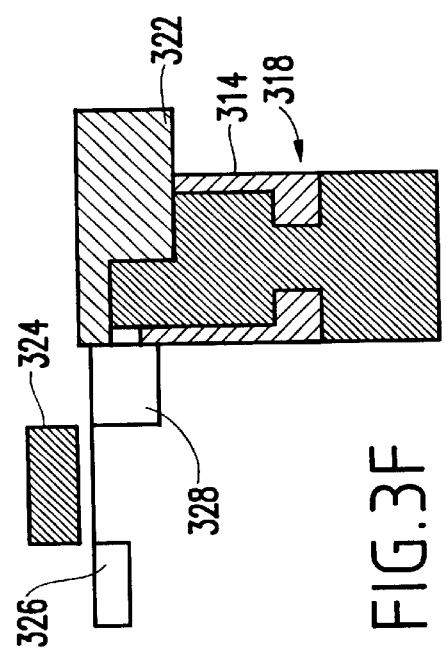

Referring now to FIG. 3(f), standard trench capacitor DRAM processing techniques are employed to complete the DRAM device. Thus, conventional processes well known to those ordinarily skilled in the art are used to pattern, deposit and dope various regions to form the shallow trench isolation (STI) oxide fill 322, gate 324, source 326, drain 328 and strap connecting the conductor 320 with the adjacent node 328.

A process for forming another embodiment of the invention is shown in FIGS. 4(a)–4(e). In this embodiment, the collar oxide 414 is formed before node dielectric formation (i.e. LOCOS collar process). A sacrificial collar nitride 407 is used to achieve unique benefits in this embodiment.

Figure 4A:
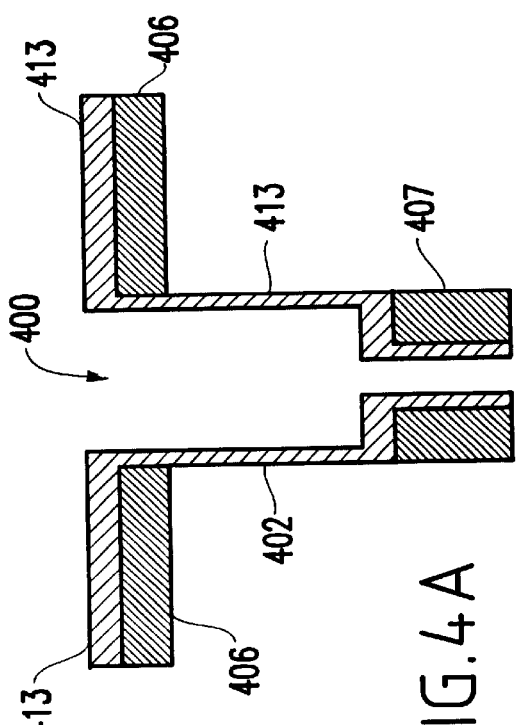
FIGS. 4(a)–4(e) depict a method for forming a trench capacitor with a collar oxide having a thickened oxide portion formed thereon according to another aspect of the present invention.

Referring specifically to FIG. 4(a), non-conformal oxide 413 (i.e. HDP oxide) is deposited in trench 400 along trench interior sidewall surfaces 402 and on the collar nitride layer 407. In addition, the non-conformal oxide 413 is deposited on the pad nitride 406. Next, the non-conformal oxide 413 is removed except from the top of nitride pad 406 and above the collar nitride 407 (FIG. 4(b)). This removal can be achieved using a conventional isotropic wet etch process.

Figure 4B:
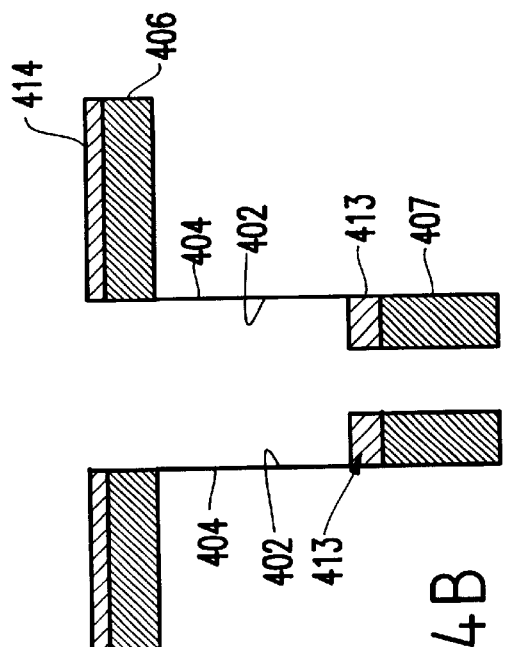

In a preferred embodiment, a hydrogen anneal process is then applied to make interior trench sidewall surfaces 402 smoother and recessed (as shown in FIG. 4(b)), which, in turn, provides for a more uniform and thicker collar oxide, without excessively narrowing the trench opening. The collar oxide 414 can be grown thermally on the interior sidewall surface 402 and exterior sidewall surface 404 of trench 400 (FIG. 4(c)). The oxide at the bottom 410 of the collar oxide is locally thicker, resulting in pedestal collar structure 418.

The oxidation rate loss at the base of trench 300 due to initial oxide layer 413 is not significant since the beginning oxide (i.e. oxide 413) and the thermally grown collar oxide 414 are relatively thin (~300 Å).

Figure 4E:
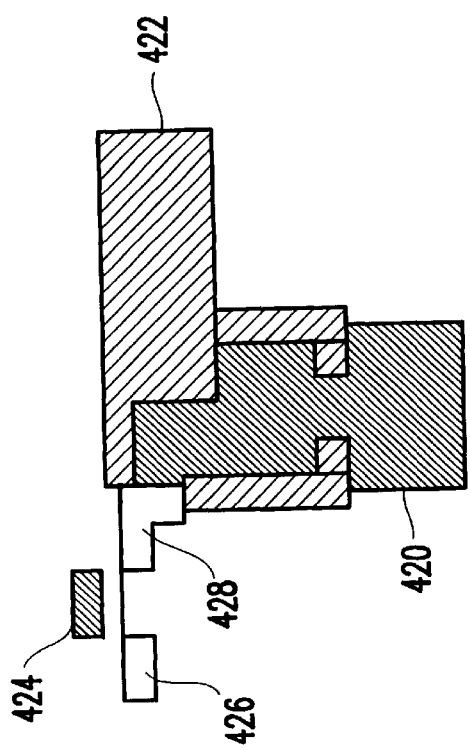
Figure 4C:
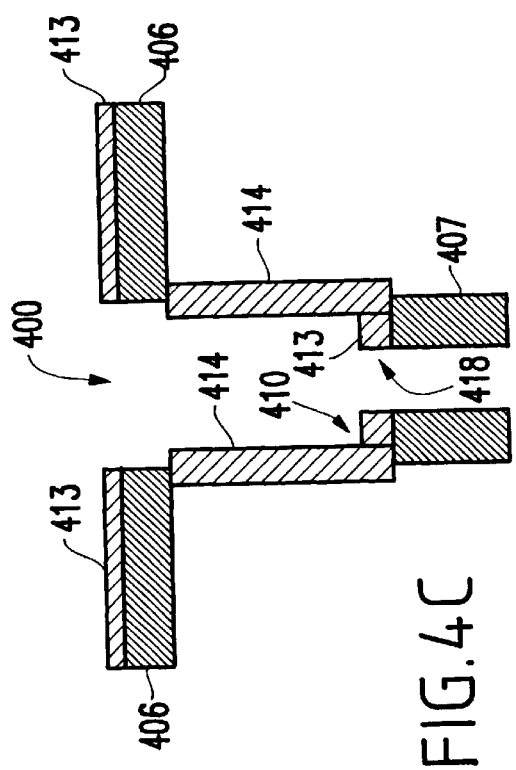
Figure 4D:
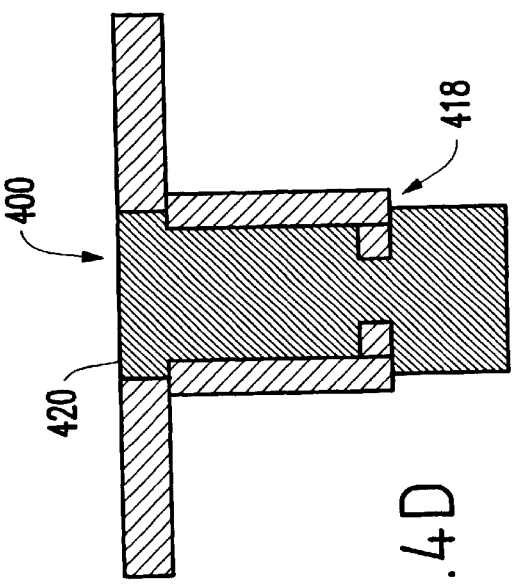

Next, standard LOCOS collar processing is used to complete the DRAM device. Nitride pad 406 and the oxide layer 413, are stripped (FIG. 4(d)). Buried plate doping and node dielectric formation are performed. Polysilicon 420 is deposited in trench 400 and CMP is performed using traditional processing techniques. Referring now to FIG. 4(e), shallow trench isolation (STI) region 422, gate 424, source 426, and drain 428 are again formed using well known processes.

With this embodiment of the invention, the collar oxide 414 can be made thicker, without excessively narrowing the trench opening. As discussed above, by making the oxide thicker, the threshold voltage can be increased and the leakage current can be reduced. Considering that there is a thinner collar oxide growth at the bottom of the collar (than other areas in the LOCOS collar), the leakage current reduction can be significant, in particular, for the LOCOS collar type trench DRAM fabrication. Further, the invention simplifies the LOCOS process.

Another embodiment and process of the invention is depicted in FIGS. 5(a)–5(h). In this embodiment, the direction of the collar oxide pedestal is changed from extending into the capacitor trench to extending away from the capacitor trench.

Figure 5A:
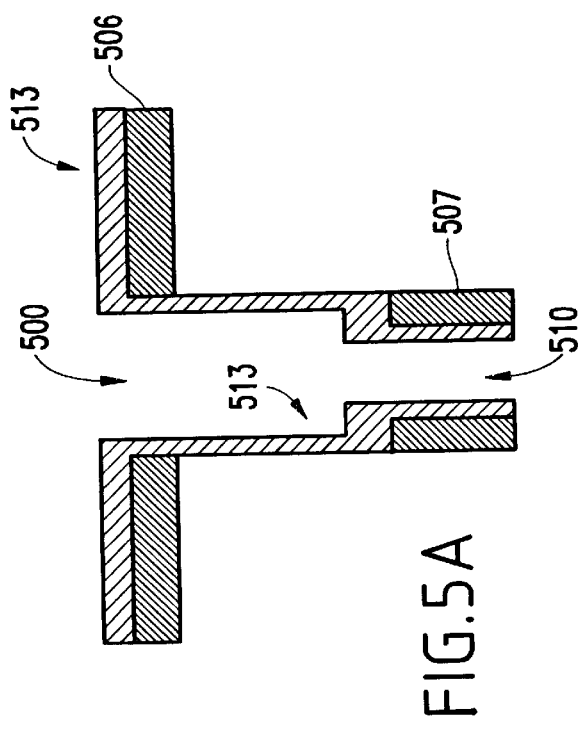

Referring specifically to FIG. 5(a), pad nitride layer 506 is formed on a silicon wafer. Collar nitride 507 is formed at the base 510 of trench 500. Next, an oxide, such as non-conformal oxide 513 is deposited. Preferably, HDP is used to deposit the non-conformal oxide 513.

Figure 5C:
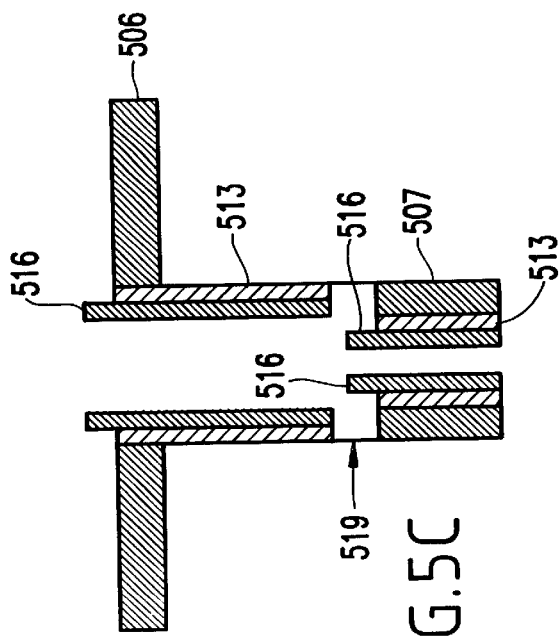
Figure 5B:
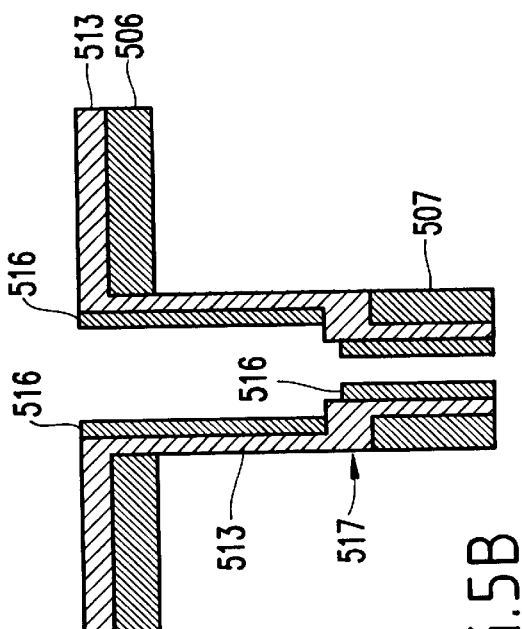

Polysilicon spacers 516 are formed on the vertical surfaces of the deposited oxide 513 (FIG. 5(b)). More specifically, the spacers are formed using, for example, an anisotropic dry etch process such as reactive ion etching (RIE). The anisotropic dry etch, or sidewall spacer etch, removes material from horizontal surfaces at a high rate, but removes material from vertical surfaces at a relatively low rate. The highly selective anisotropic spacer etch leaves material along the sidewall of the oxide but removes material from the horizontal surfaces.

This process allows a bottom corner portion 517 of the non-conformal oxide 513 portion to remain exposed after polysilicon spacer formation.

A wet oxide etch is then used to selectively remove the exposed bottom corner portion 517 of non-conformal oxide 513 to create oxide undercut 519 (FIG. 5(c)). In addition, non-conformal oxide 513 on the horizontal surfaces of nitride pad 506 is removed (FIG. 5(c)).

Figure 5D:
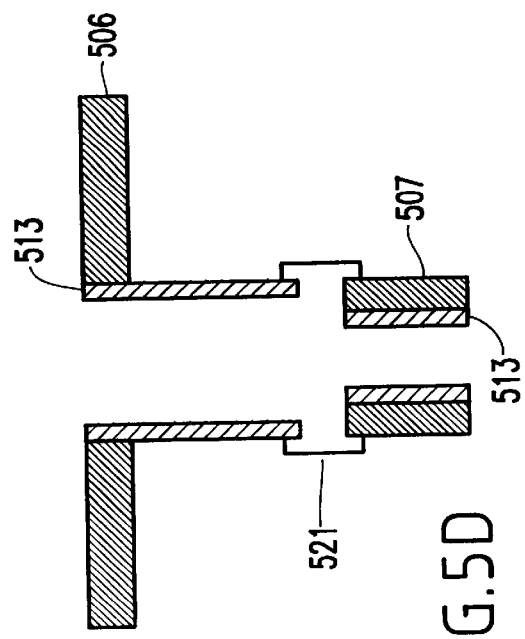

Subsequently, a silicon undercut is performed adjacent the oxide undercut opening 519 to form substrate undercut 521 (FIG. 5(d)). During the silicon undercut process, the polysilicon spacers 516 are also removed (FIG. 5(d)).

A HDP oxide strip process removes the residual portion of non-conformal oxide 513 (FIG. 5(e)). Thermal oxide is grown on both the interior sidewall surfaces 502 and exterior sidewall surfaces 504 to form the collar oxide 514 (FIG. 5(f)). Thicker oxide is grown in the silicon undercut 521 region since the oxidation can occur from three sides as compared to from one side in the case of the embodiments of FIGS. 3 and 4. The locally thick oxide portion forms pedestal collar 518. Once again, the pedestal collar will produce the benefits discussed above.

The remaining process proceeds the same as in the previous embodiments. A standard LOCOS collar process can be applied to complete the DRAM device. Nitride pad 506 is removed (FIG. 5(g)). At this point, buried plate doping and node dielectric formation can be performed. Finally, polysilicon 520 is deposited in trench 500 and CMP is performed using traditional processing techniques. Referring now to FIG. 5(h), shallow trench isolation (STI) oxide fill 522, gate 524, source 526 and drain 528 are formed as discussed above.

The embodiment depicted in FIGS. 5(a)–5(h) and as described above, provides for a longer leakage path as compared with the other forms of the invention such as those depicted in FIGS. 3 and 4 and thereby reduces leakage current. The pedestal collar 518 can be extended further in a direction away from trench 500 than can pedestal collars 318, 418 be extended inward, relative to trenches 300, 400, respectively. As a result, this embodiment may provide even further enhanced charge retention.

A second advantage of the embodiment of FIGS. 5(a)–5(h) is that there is no resistance increase due to pedestal collar oxide 518 as pedestal collar 518 extends away from trench 500 rather than extending into trench 500. The width of polysilicon 520 (formed/deposited in trench 500) is not reduced at any point by the pedestal collar 518. Consequently, pedestal collar 518 does not lead to any increase in resistance.

A further embodiment (which is related to the embodiment of FIGS. 4(a)–4(e)), is depicted in FIGS. 6(a)–6(f). Instead of a relatively thick pad nitride 406 (which forms a nitride collar 407 in FIG. 4(a)), a stacked layer 605 of ASG (Arsenic Silicate Glass) 607 and collar nitride 609 are formed on a silicon substrate (FIG. 6(a)).

The trench structure is then filled with a sacrificial material such as photoresist 615. The stacked layer 605 is etched with a resist recess process to form open collar region 611 (FIG. 6(b)).

Figure 6C:
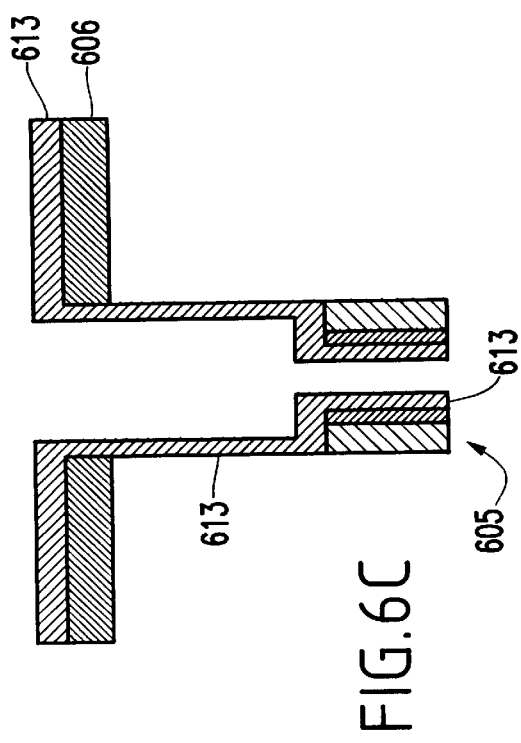
FIGS. 6(a)–6(f) depict a method for forming a trench capacitor with a collar oxide having a thickened oxide portion formed thereon according to yet another aspect of the present invention.
Figure 6D:
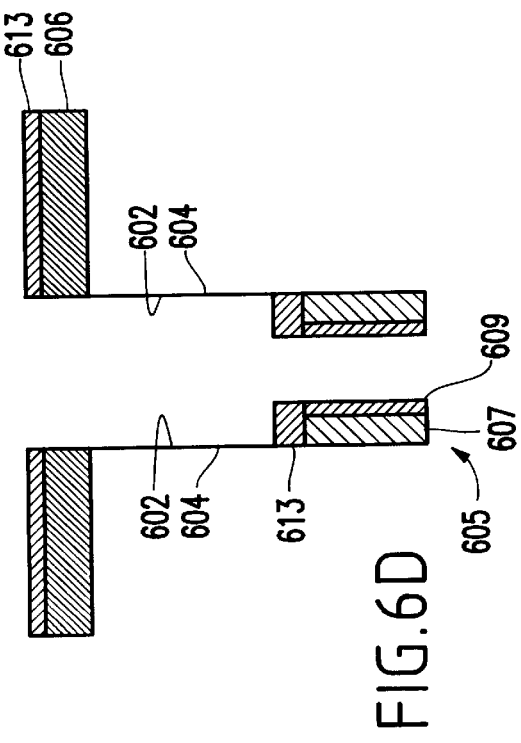

Next, the sacrificial material 615 is removed and an HDP oxide deposition is performed in sequence to form HDP oxide layer 613 (FIG. 6(c)). A wet etch process selectively removes HDP oxide 613 except from the top of the stacked layer 605 and pad nitride 606 (FIG. 6(d)).

Figure 6A:
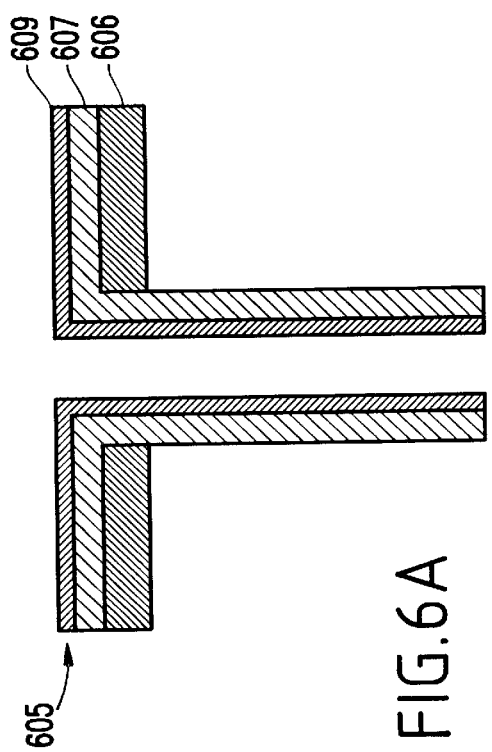
Figure 6B:
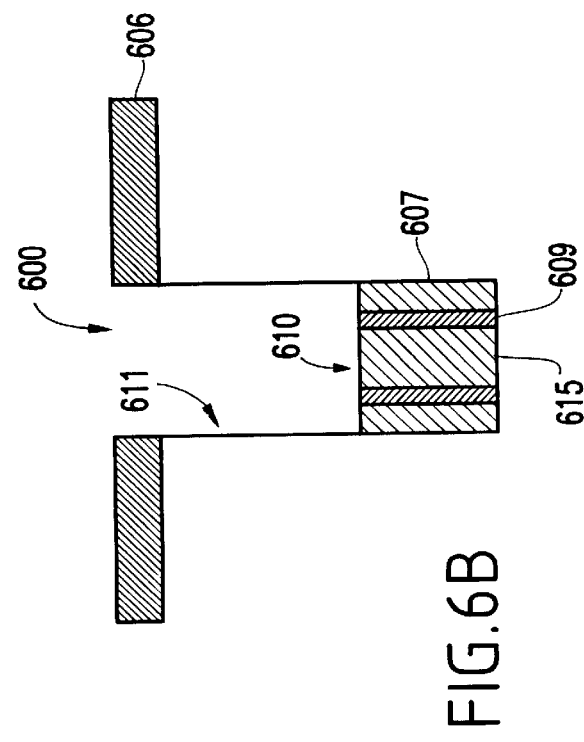
Figure 6E:
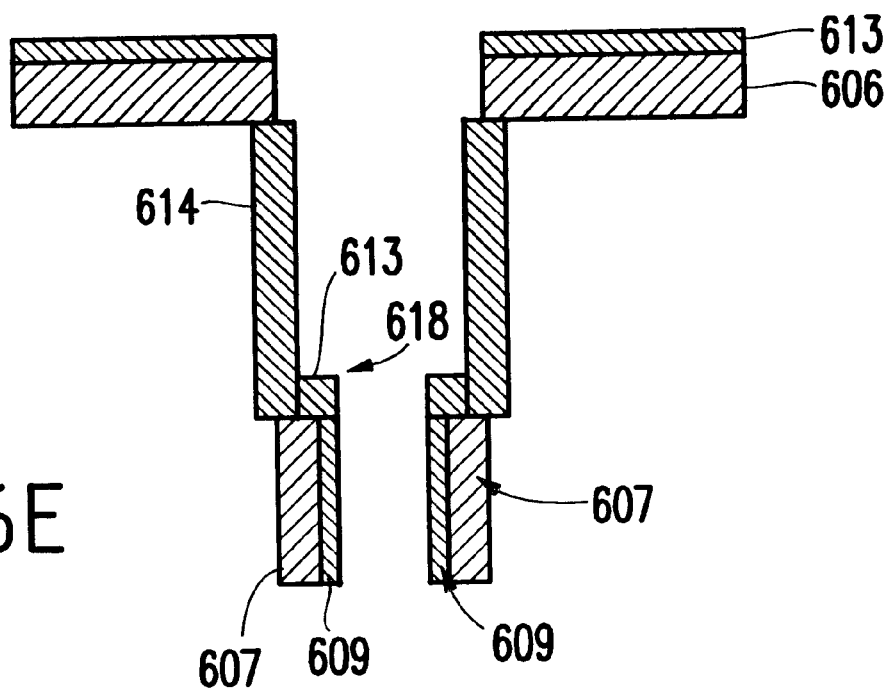
Figure 6F:
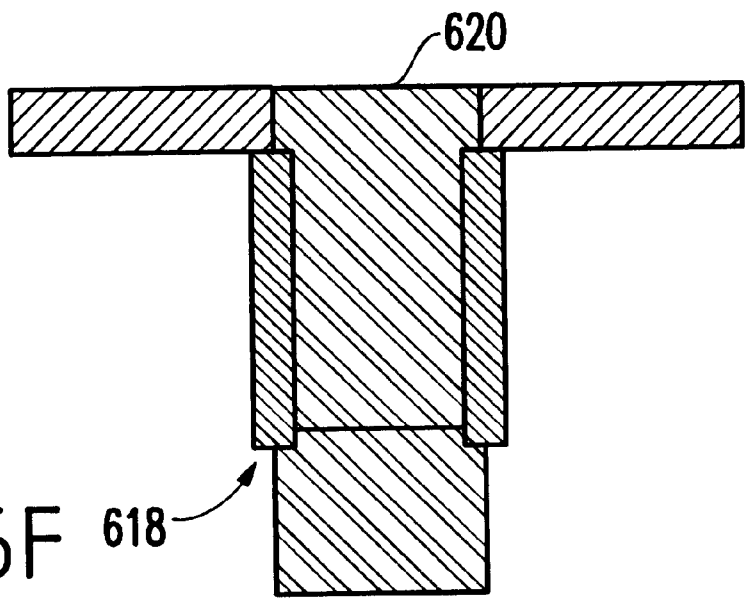

Thermal oxidation is grown on both interior sidewall surface 602 and exterior sidewall surfaces 604 of trench 600 to form collar oxide 614 (FIG. 6(e)). The remaining HDP oxide 613 forms pedestal collar 618 (i.e., a locally thick oxide portion) on collar oxide 614. Subsequently, ASG 607 and collar nitride 609 are stripped (FIG. 6(f)). Next, the node dielectric is formed, the storage plate is filled with polysilicon 620 and planarized by CMP (FIG. 6(f)). Finally, a completed DRAM device can be processed as depicted in FIG. 4(e) and described above.

One advantage of the embodiment of FIGS. 6(a)–6(7), is the reduction or elimination of diffusion of As by the collar oxidation. The remaining HDP oxide 613 (FIG. 6(d)) prevents As out-diffusion during collar oxide 614 formation (FIG. 6(e)). In a typical LOCOS process, depending on the thickness of the collar oxide and the ASG drive-in conditions, undesirable As can be diffused through the collar oxide, which reduces the threshold voltage of the parasitic vertical transistor. However, the present invention prevents this diffusion through the use of collar oxide 614 and maintains a high threshold and a corresponding low leakage current. Since collar oxide 614 is not exposed to As ambient conditions during oxidation/diffusion, the collar oxide 614/silicon substrate interface can be As impurity free.

Another advantage of the embodiment of FIGS. 6(a)–6(f), is that trench sidewall doping (e.g., processed after LOCOS collar oxide formation) can be combined with the collar oxide formation process, reducing process steps and thermal budget. More specifically, the ASG layer 607 includes the impurity As. During the oxide growth 614 in FIG. 6(e), the As impurity diffuses into the trench sidewall. Thus, the invention avoids a separate impurity diffusion step that is required conventionally.

Figure 7A:
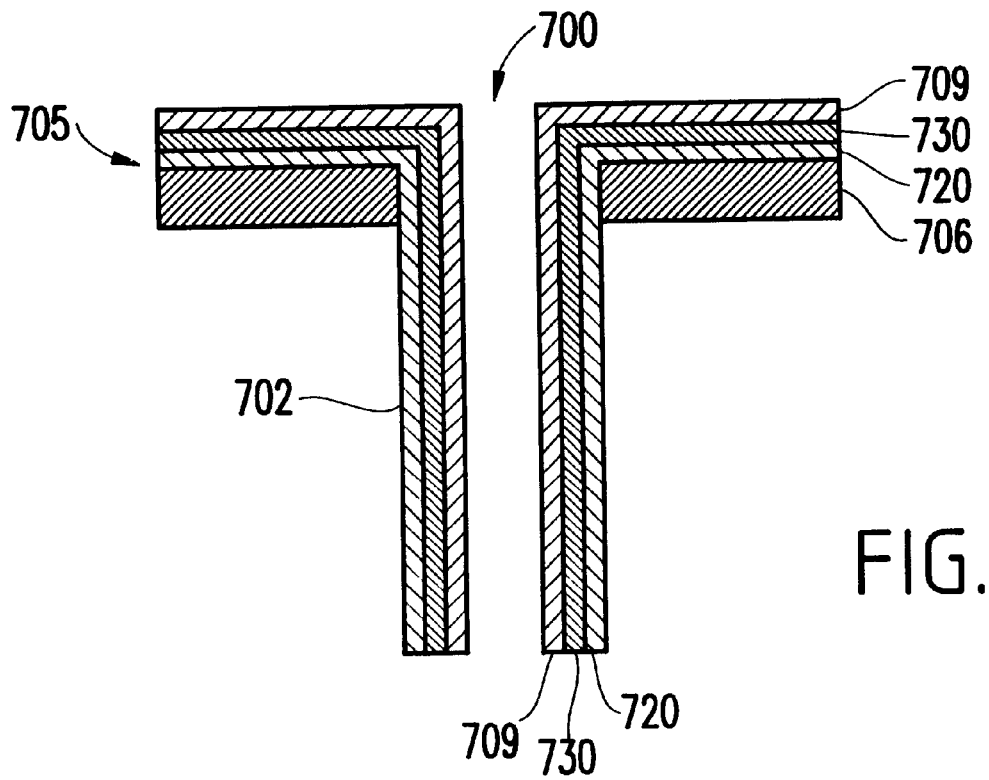
FIGS. 7(a)–7(f) depict a method for forming a trench capacitor with a collar oxide having a thickened oxide portion formed thereon according to yet another aspect of the present invention.
Figure 7B:
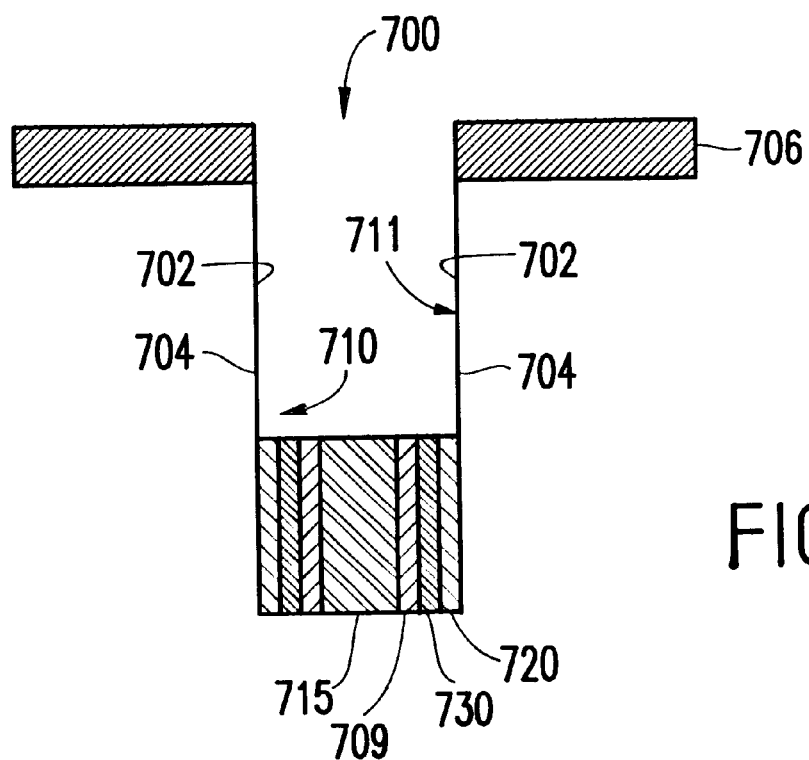
Figure 7C:
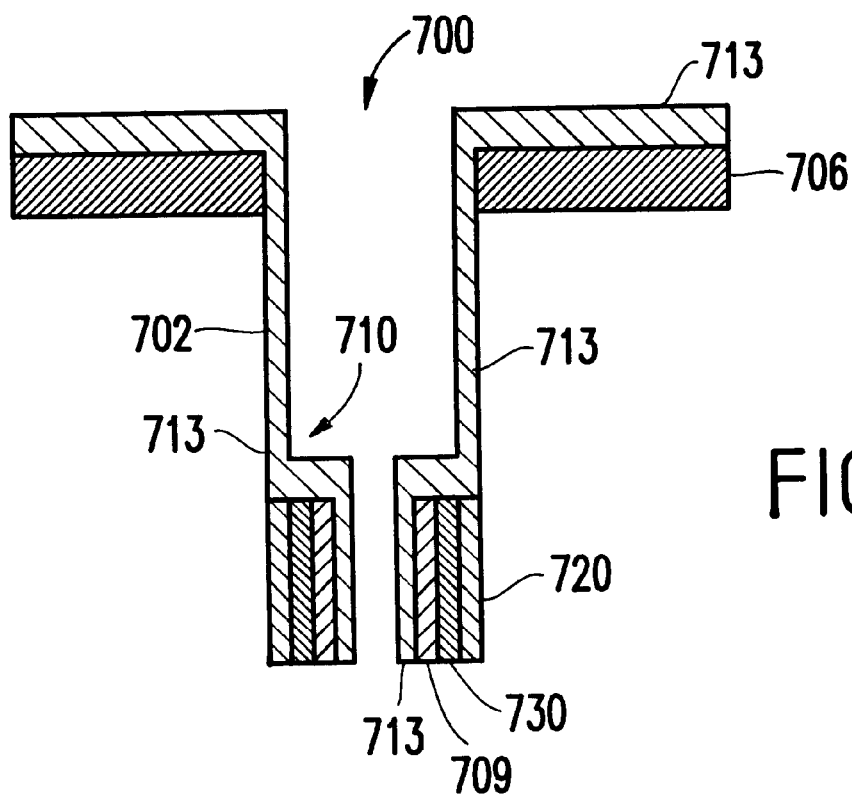
Figure 7D:
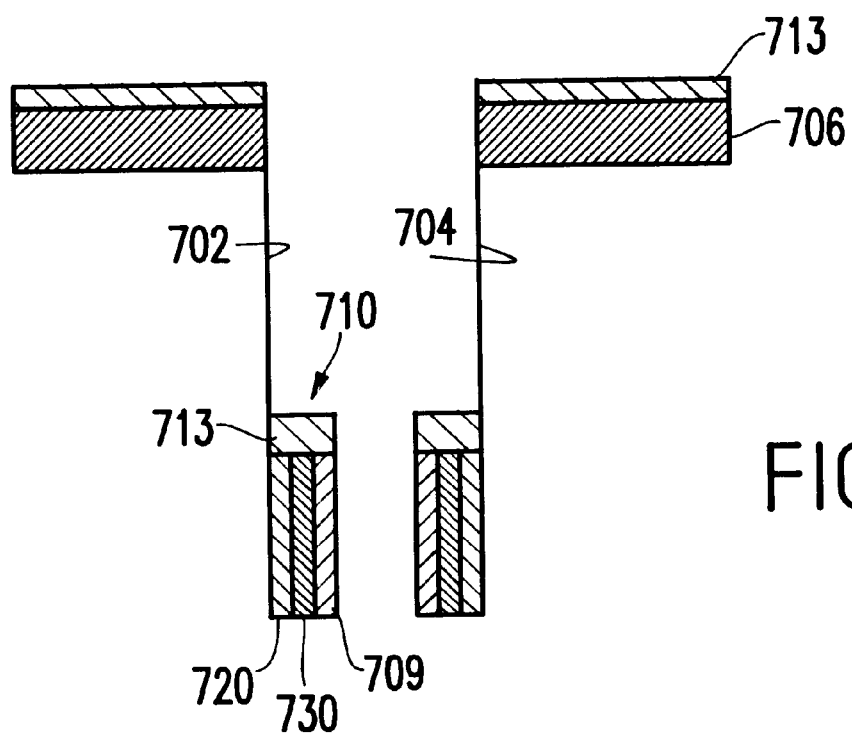
Figure 7E:
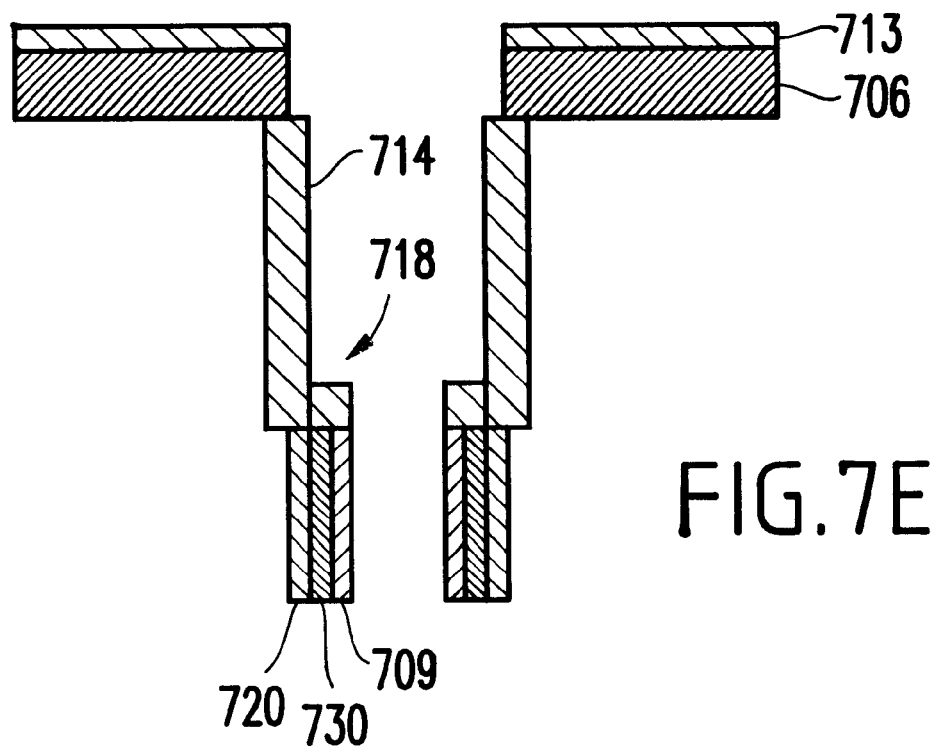
Figure 7F:
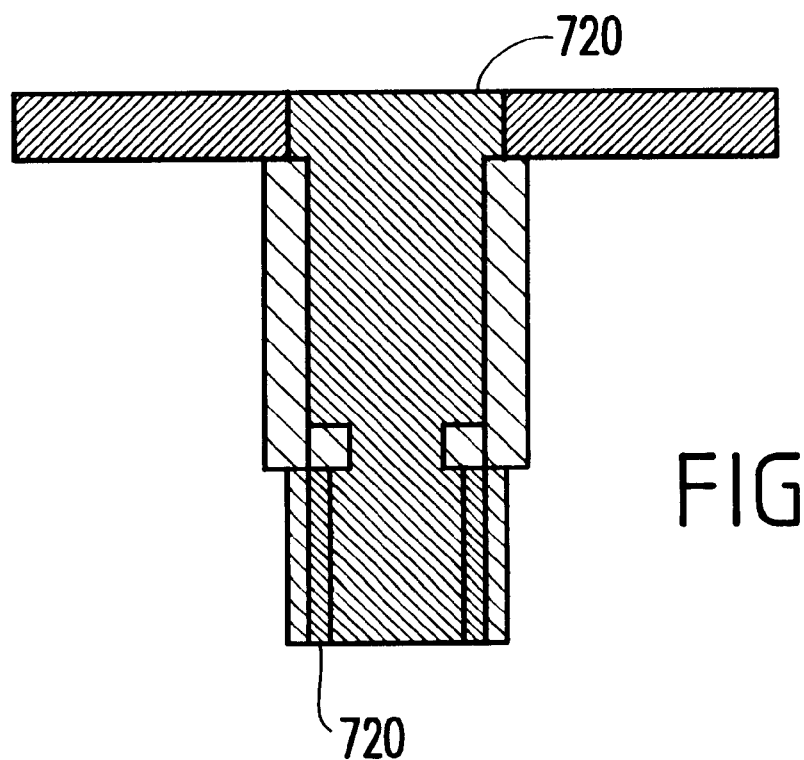

Yet another embodiment of the invention is depicted in FIGS. 7(a)–7(f). In this embodiment, a metal layer, 730 such as TiN, is combined with collar nitride 709 to reduce the resistance of storage polysilicon 720. Referring now specifically to FIG. 7(a), layers 705 of pad nitride 706, storage polysilicon 720 (for node dielectric), metal layer 730 and collar nitride 709 are formed on a silicon substrate and on the interior sidewall surfaces 702 of trench 700 after standard deep trench (DT), buried plate doping processing, and node dielectric film formation.

Photoresist 715 is deposited inside trench 700 and a resist recess process is used to form open collar region 711 (FIG.

7(b)). The resist 715 is then removed and a HDP oxide 713 is deposited on the interior sidewall surfaces 702 of trench 700(FIG. 7(c)). Next, HDP oxide 713 is removed except at the bottom of collar region 710 (FIG. 7(d)) as described above. The remaining HDP oxide 713 covering the metal 730 prevents potential metal oxidation from occurring during subsequent processing. Collar oxide 714 is thermally grown on the trench interior sidewall surfaces 702 and the exterior sidewall surfaces 704 (FIG. 7(e)). A locally thick oxide portion of collar 714 forms pedestal collar 718 as described above. Collar nitride 709 is etched (FIG. 7(e)) before strap polysilicon 720 deposition (FIG. 7(f)) to provide an electrical connection between the metal 730 and the polysilicon 720.

Therefore, the inventive pedestal collar structure reduces leakage current (with a thicker oxide) without increasing the storage conductor resistance (because the oxide is thicker only in a portion of the trench). The various embodiments described above also limit the amount that the trench opening is narrowed, form the pedestal into the surrounding substrate (to eliminate any resistance increase), reduce impurity out diffusion, and include a metal layer to further reduce resistance.

While the invention has been described in terms of preferred embodiments, those skilled in the art will recognize that the invention can be practiced with modification within the spirit and scope of the appended claims.

What is claimed is:

1. A memory device comprising:
   a substrate,
   a trench in said substrate, said trench having an upper portion; and
   a collar oxide in said upper portion of said trench,
   wherein said collar oxide includes a pedestal, and
   wherein said pedestal comprises a region of increased thickness of said collar oxide.

2. The device in claim 1, wherein said pedestal is positioned on a lower portion of said collar oxide.

3. The device in claim 1, wherein said pedestal comprises approximately 10% of a length of said trench.

4. The device in claim 1, further comprising a conductor filling said trench, wherein said pedestal extends into said conductor.

5. The device in claim 1, wherein said pedestal extends into said substrate.

6. The device in claim 1, further comprising a metal liner in said trench below said pedestal.

7. A dynamic random access memory device comprising:
   a substrate;
   a trench in said substrate, said trench having an upper portion;
   a collar oxide in said upper portion of said trench, said collar oxide including a pedestal; and
   a conductor filling said trench,
   wherein said pedestal reduces a leakage of a charge on said conductor, and
   wherein said pedestal comprises a region of increased thickness of said collar oxide.

8. The device in claim 7, wherein said pedestal is positioned on a lower portion of said collar oxide.

9. The device in claim 7, wherein said pedestal comprises approximately 10% of a length of said trench.

10. The device in claim 7, wherein said pedestal extends into said conductor.

11. The device in claim 7, wherein said pedestal extends into said substrate.

12. The device in claim 7, further comprising a metal liner in said trench below said pedestal.

13. A method of forming a memory device comprising:
    forming a trench in a substrate;
    depositing a non-conformal oxide in an upper portion of said trench; and
    forming pedestals on a portion of said non-conformal oxide,
    wherein said pedestals comprise a region of increased thickness of said non-conformal oxide.

14. The method in claim 13, further comprising:
    filling a lower portion of said trench with a conductor before depositing said non-conformal oxide;
    forming sacrificial spacers along said non-conformal oxide such that a lower portion of said non-conformal oxide is exposed;
    removing said lower portion of said non-conformal oxide to form said pedestals;
    removing said sacrificial spacers; and
    filling said upper portion of said trench with a conductor.

15. The method in claim 13, further comprising, before said forming of said pedestals, implanting an impurity through said non-conformal oxide, wherein, based on an inconsistent thickness of said non-conformal oxide, said impurity is prevented from passing through horizontal surfaces and only passes through vertical surfaces to sidewalls of said trench.

16. The method in claim 13, wherein said forming of said pedestals comprises:
    forming sacrificial collar spacers in a lower portion of said trench before said depositing of said non-conformal oxide;
    removing said non-conformal oxide from vertical surfaces such that said pedestals remain;
    growing an upper collar oxide on said upper portion of said trench;
    removing said sacrificial collar spacers; and
    filling said trench with a conductor.

17. The method in claim 16, further comprising forming a doped glass layer between said lower portion of said trench and said sacrificial collar spacers, wherein during said growing of said upper collar oxide, an impurity diffuses from said doped glass layer to sidewalls of said trench.

18. The method in claim 16, further comprising forming a metal layer between said lower portion of said trench and said sacrificial collar spacers.

19. The method in claim 13, wherein said forming of said pedestals comprises:
    forming sacrificial collar spacers in a lower portion of said trench before said depositing of said non-conformal oxide;
    forming second spacers on said non-conformal oxide, such that an exposed portion of said non-conformal oxide remains;
    removing said exposed portion of said non-conformal oxide;
    undercutting said substrate in areas previously adjacent said exposed portion to produce undercut openings;
    removing said second spacers and said non-conformal oxide;
    growing an upper collar oxide and said pedestals, wherein said pedestals are positioned within said undercut openings;
    removing said collar spacers; and
    filling said trench with a conductor.

* * * * *